United States Patent [19]

Chiang

[11] 4,442,188

[45] Apr. 10, 1984

[54] SYSTEM FOR SPECIFYING CRITICAL DIMENSIONS, SEQUENCE NUMBERS AND REVISION LEVELS ON INTEGRATED CIRCUIT PHOTOMASKS

[75] Inventor: Ping-Wang Chiang, Los Gatos, Calif.

[73] Assignee: Amdahl Corporation, Sunnyvale, Calif.

[21] Appl. No.: 222,254

[22] Filed: Jan. 2, 1981

[51] Int. Cl.³ .............................................. G03F 9/00
[52] U.S. Cl. ........................................ 430/5; 430/22; 430/311; 430/394; 430/396; 356/401
[58] Field of Search ..................... 430/5, 22, 311, 394, 430/396; 356/401

[56] References Cited

U.S. PATENT DOCUMENTS

3,690,881 9/1972 King ...................................... 430/22

Primary Examiner—John E. Kittle
Assistant Examiner—Jose' G. Dees
Attorney, Agent, or Firm—Fliesler, Dubb, Meyer & Lovejoy

[57] ABSTRACT

A system for specifying critical dimensions, mask sequence levels, and mask revision levels on integrated circuit photomasks and chips involving use of a patterned array of geometric regions containing preselected indicia in each region corresponding to the mask sequence number for an associated photomask. The preselected indicia may be either a critical diemension pattern to integrate the mask sequence indicia with the critical dimension specification or a mask revision level code to integrate the mask sequence number with the revision level, or a combination of both a critical dimension pattern and a mask revision level code. In the latter case the mask revision level code is integrated with the critical dimension pattern to conserve space on the photomask and the IC chip.

14 Claims, 9 Drawing Figures

SYSTEM FOR SPECIFYING CRITICAL DIMENSIONS, SEQUENCE NUMBERS AND REVISION LEVELS ON INTEGRATED CIRCUIT PHOTOMASKS

This invention relates to semiconductor integrated circuit manufacturing technology and, more specifically, to a system for specifying critical dimensions, mask sequence numbers, and revision levels on photomasks used in processing semiconductor wafers into integrated circuits.

Semiconductor processing technology for transforming a semiconductor wafer into a plurality of integrated circuit (IC) chips involves a complex sequence of process steps which must be accurately performed to produce a high yield of working chips among the large number of candidate dice on each processed wafer. One of the most critical aspects of semiconductor processing technology involves photolithography steps which are utilized to produce patterned masking layers on the wafer which in turn are utilized to create the topographical and topological structure of diffused regions, overlying insulating layers, and conducting layers which comprise an integrated circuit. A typical semiconductor process involves a number of sequential photolithography operations, each of which must be performed in its proper sequence and with good process control in order to produce a high yield of good IC chips. If one of the set of photomasks is utilized out of sequence, all of the chips on the semiconductor wafer will be defective and the overall process yield and cost of production will be adversely impacted. Since semiconductor wafers are typically processed in batches involving a substantial number of wafers in each batch and each wafer is subjected to the same photolithography steps at the same time, a mask error may affect all of the wafers in the batch. Although each batch of semiconductor wafers being processed will typically have a run sheet, commonly called a traveller, associated with it which is designed for the processing personnel to record the performance of the various steps in the processing sequence, it is still possible for processing personnel performing the important mask selection and mask alignment functions for photolithography steps in the process to misread the traveller or accidentally pull the wrong photomask. If the processing personnel cannot ascertain during alignment of the photomask on the wafer that the wrong photomask has been selected, then the error in mask selection may go undetected and result in a defective wafer.

Another important aspect of maintaining control of a complicated IC manufacturing process involves measuring the so-called "critical dimension" associated with the process, both after the photoresist mask pattern has been developed and after etching the underlying layer using the photoresist mask pattern. If the critical dimension pattern on the wafer is difficult to find, processing personnel may tend to skip the measurement of the critical dimension. Skipping this measurement can cause loss of quality control of the process, and undetected, careless and faulty photolithography can result in production of defective wafers.

Another important aspect of semiconductor IC technology is the effective use of every portion of the chip area on the wafer in order to maximize the number of candidate dice that fit on the size of wafer being processed. Because of the importance of communicating on the photomask itself the mask sequence number, the critical dimensions and the mask revision level, the trend in the semiconductor industry has been towards providing a coding of the mask sequence number and mask revision level along with the critical dimension pattern on each mask for replication onto each candidate die on the semiconductor wafer. In this manner the mask alignment personnel can readily determine that they have the proper mask for the photolithography operation which is next required to be performed on the wafer. In addition, processing personnel can verify that the proper revision level of the mask is being used during the mask alignment. Also the processing personnel can readily find the critical dimension pattern for measuring purposes.

Figure 1:
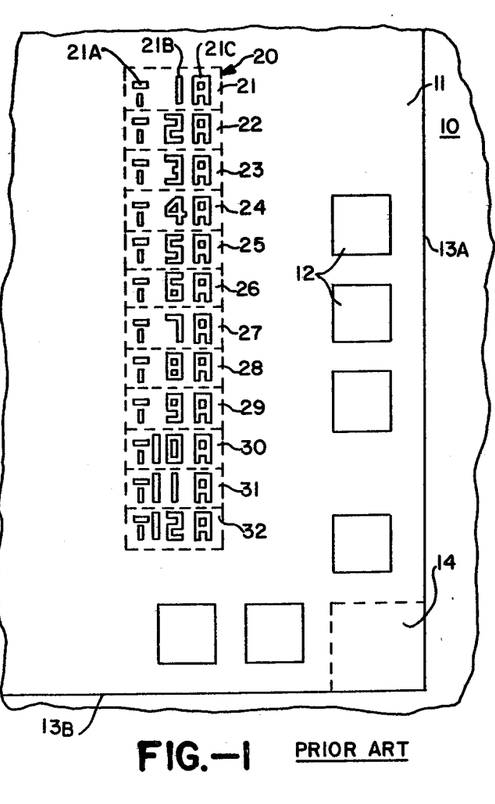
FIG. 1 is a top plan view of a section of a semiconductor wafer showing a portion of an integrated circuit die with a photomask sequence coding pattern of a conventional prior art type formed thereon.

One conventional approach to providing the mask sequence number, mask revision level and critical dimension pattern on each mask is illustrated in FIG. 1 of the drawings. FIG. 1 illustrates a semiconductor wafer 10 which has undergone a sequence of twelve photolithography operations, each of which has resulted in producing on each die on the wafer a list of the mask numbers and the revision levels of each mask utilized during the processing. In this particular case, twelve photolithography processing steps were involved in the processing of this particular wafer but it should be understood that various semiconductor processes utilize different numbers of photolithography steps. In FIG. 1, a portion of a single candidate die 11 on semiconductor wafer 10 is illustrated. On this single candidate die 11 a photomask coding pattern 20 has been formed. Each of the twelve photomasks which has been used to produce the overall mask coding pattern 20 shown in FIG. 1 has formed on it, in a corresponding subarea of the mask, a single element of the coding structure. The remainder of the overall area of the total coding pattern on each mask is left free of circuit topography patterns so that the overall coding structure can be built up as each mask is used in sequential photolithography operations and intervening process steps. In other words, the first photomask used in the first photolithography operation will have the code element 21 formed thereon while the area on that mask corresponding to the coding elements 22 through 32 will be blank. If the die 11 were viewed after the first photomask has been utilized in the first photolithography operation, only the coding element 21 would appear on the die. The same coding element would appear on each die formed on the wafer. Correspondingly, the second photomask would have the second coding element 22 formed on the mask with the remainder of the area of the coding pattern 20 left free of circuit topography. The third photomask in the series would have the coding element 23 formed thereon leaving the remainder of the coding pattern area on that mask blank.

As shown in FIG. 1, each coding element in the coding pattern consists of three parts. Taking coding element 21 as an example, the first part 21A consists of a critical dimension pattern which, as is well known, permits a later measurement of the resolution accuracy of the photolithography operation. Various types of critical dimension patterns may be utilized, each having the common characteristic of a pattern of lines and spaces of varying widths, which enable the measurement of the resolution of the photolithography operation after it has been performed on the wafer. The conventional prior art approach to the critical dimension pattern involves utilization of a pattern which is a completely separate part of the coding element on each mask. The second part of the coding element is the mask sequence number 21B. The mask sequence number simply gives the number of that particular mask so that its place in the sequence can be identified. The third part of the coding element is the mask revision level 21C which is again a completely separate part of the coding element scheme in the conventional system illustrated in FIG. 1.

While the conventional coding structure illustrated in FIG. 1 accomplishes the purpose of specifying the critical dimension, mask sequence number and mask revision level, it should be apparent that the amount of die area which is consumed by this coding structure is quite substantial and correspondingly increases the overall IC die size. For example, the die area consumed by the coding pattern 20 is about 120 microns by 500 microns or a total area of about 60,000 square microns. Increasing the size of each die on the wafer reduces the number of candidate dice and correspondingly increases the cost of semiconductor fabrication. Furthermore, sometimes it is not feasible to put all of the coding elements of a conventional coding pattern together in one location on a particular mask set for a particular circuit due to the constraints of the circuit design and the size of the coding pattern. Consequently, sometimes the coding pattern is divided into two or three parts located at different places on the die. This makes it difficult for the process operators to find the coding pattern and ascertain that the proper mask sequence is being followed during processing. It is thus apparent, that although the conventional coding structure illustrated in FIG. 1 satisfies the basic purpose of such a coding structure, the overall size of the coding structure represents a substantial disadvantage as far as maximizing effective use of available area on the wafer.

Accordingly, it is a principal object of this invention to provide an improved method for producing a mask coding pattern on photomasks used for semiconductor processing.

It is another object of this invention to provide a mask coding pattern which requires the use of minimal area on each photomask and corresponding area on each die for recording the coding structure.

In accordance with one aspect of this invention the above-stated objects are achieved in a method for specifying critical dimensions and mask sequence numbers on photomasks used for processing semiconductor wafers into semiconductor integrated circuits. The method includes the step of selecting prior to mask design and generation a photomask subarea to be utilized as a coding pattern area on each photomask and to be left free of circuit topography patterns. The method further includes the step of forming on each photomask designed and generated for sequential use during sequential photolithography steps in wafer processing a coding pattern in the form of a prearranged marked array of geometric areas together with a preselected indicia located in a prearranged one of said geometric areas indicating the particular mask sequence number associated with each of said photomasks. Preferably, the preselected indicia comprises a critical dimension pattern. It is also preferable that the coding pattern is further adapted to specify also the mask revision level for each photomask and a prearranged code indicating the revision level of each mask is formed along with said critical dimension pattern in the prearranged geometric area of each of said photomasks. Preferably, to reduce the space requirement for including the mask revision level code, at least one segment of the mask revision level code is incorporated into at least one of the vertical and horizontal arrangements of repetitive line and space segments utilized as the critical dimension pattern in the coding pattern.

In accordance with another aspect of this invention, the above-stated objects are achieved in a set of photomasks adapted to be used during sequential photolithography processing steps in an overall process for manufacturing integrated circuit chips on a semiconductor wafer which incorporates a coding pattern for specifying critical dimensions and mask sequence numbers for each of the photomasks. The coding pattern comprises a preselected common subarea of each photomask left free of circuit topography patterns and having formed thereon a prearranged marked array of geometric areas together with a preselected indicia, such as a critical dimension pattern located in a prearranged one of said geometric areas indicating the particular mask sequence number for each of said photomasks. Preferably, the coding pattern is also adapted to specify mask revision levels for each photomask and consequently a code indicating the revision level is also formed along with the critical dimension pattern in the prearranged geometric area on each mask. To conserve space, at least one segment of the mask revision level code is incorporated into at least one of the vertical and horizontal arrangements of repetitive line and space segments used in the critical dimension pattern.

The principle advantage of this invention is that it accomplishes the purpose of a coding pattern on each of the photomasks in a set for producing a particular IC device without mortgaging a large area of each die on a wafer to recording the elements of the coding pattern as each mask is utilized during sequential photolithography operations. The coding pattern of this invention eliminates the need for utilizing a separate part of the coding structure for the critical dimension pattern and the mask sequence code. Furthermore, by integrating a segment of the mask revision level code into the critical dimension pattern, further conservation of die area is achieved. The substantial reduction in die area achieved in accordance with this invention enables the placement of the coding pattern on each mask in a convenient area often not utilized at all for circuit topography such as one of the corners of the die. By shrinking the space requirement for the coding pattern in accordance with the concepts of this invention, space within the coding pattern for recording up to sixteen mask levels can be provided while utilizing die area corresponding to area which would be consumed by one bonding pad (assuming a three micron critical process dimension and conventional bonding pad design rules involving one hundred micron square bonding pads separated from the die edge and from each other by fifty microns). This contrasts with the area corresponding to six or seven bonding pads which is consumed by the conventional coding pattern depicted in FIG. 1 of the drawings. Reducing the size of the coding structure results in a smaller die size and a larger number of candidate die on each wafer. Thus, the coding structure of this invention favorably impacts the manufacturing cost of a particular integrated circuit device.

Other objects, features, and advantages of this invention will be apparent from a consideration of the following detailed description in conjunction with the accompanying drawings.

As previously indicated, FIG. 1 illustrates a photomask sequence coding pattern in accordance with the prior art. This coding pattern has been described above, and that description need not be repeated here.

Figure 2:
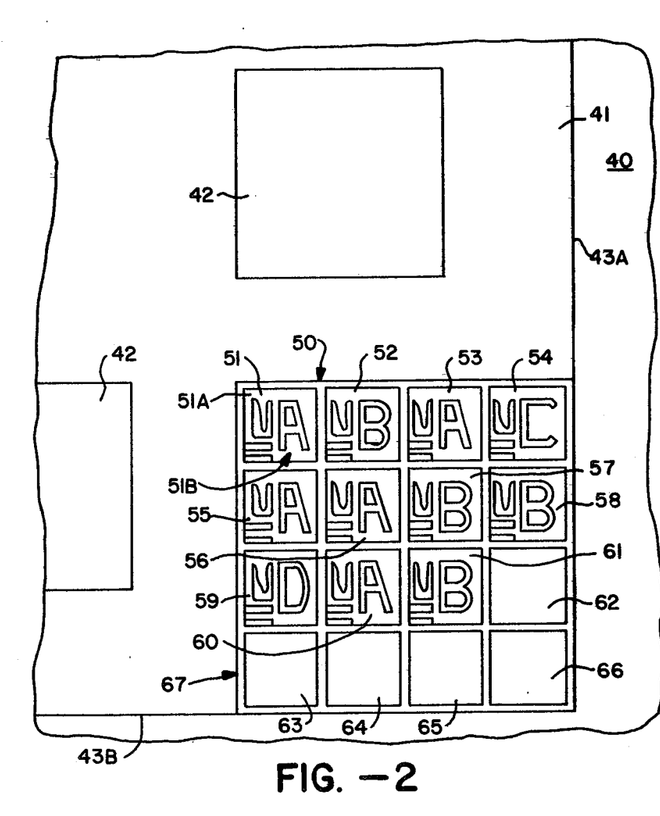
FIG. 2 is a top plan view of a section of a semiconductor wafer illustrating a portion of an integrated circuit die having a photomask sequence coding pattern in accordance with this invention formed thereon.

FIG. 2 depicts a photomask sequence coding pattern in accordance with this invention after that coding pattern has been written into the topology and topography of an individual die 41 on a semiconductor wafer 40. As shown in FIG. 2, the photomask sequence coding pattern, which will be referred to hereafter variously as "coding pattern" or "photomask coding pattern", occupies a small area of one corner of die 41 on wafer 40. The lines 43A and 43B represent the edges of the scribe line for the die 41. The scribe line is utilized when the wafer 40 is diced up into individual IC chips. The coding pattern 50 of this invention fits into an area which is represented by the square designated 14 in FIG. 1. Conventional design rules for integrated circuit chips involve bonding pads 42 having 100 micron sides with their outside edges separated from the scribe line edges 43A and 43B by about 50 microns. It is thus seen that the area of the coding pattern 50 is about 150 by 150 microns. Coding pattern 50 thus occupies the area of a die corresponding to that consumed by a single bonding pad.

The photomask sequence coding pattern 50 consists of a marked array of geometric areas labeled 51 through 66. Each of the geometric areas 51 through 66 is associated with a prearranged one of the photomasks which are utilized in forming the IC structure on die 41. Any desired correlation between the particular location of a particular geometric area in the array and a corresponding mask sequence number can be utilized. Most conveniently for use in the United States and western countries the sequence will involve a numbering from left to right across each row of the array. In this manner the geometric area 51 corresponds to the first mask, the geometric area 52 corresponds to the second mask and so on. Using this scheme, the geometric area 55 would represent the fifth mask, the geometric area 59 would represent the ninth mask, and the geometric area 63 would represent the thirteenth mask. In all sixteen masks can be represented by this four by four array of geometric areas. As shown in FIG. 2, the array of geometric areas is marked by a grid of horizontal and vertical lines designated 67 in FIG. 2. FIG. 2 depicts the die 41 after all photolithography operations and related process steps associated with eleven separate photomasks have been performed on wafer 40. At the time of each photolithography operation utilizing a particular photomask in the overall sequence, one of the geometric areas in the array 50 will have formed thereon a critical dimension pattern, e.g., 51A, and a mask revision level code, e.g., 51B. In other words, as the first photolithography operation is performed using the first photomask, the critical dimension pattern 51A and the mask revision level code 51B will be written into the topology and topography of the die 41 in the geometric area 51. After that first photolithography operation the marked array of geometric areas 50 will be defined by the grid line 67 formed on die 41 but only the geometric area 51 will have the critical dimension pattern and the mask revision level pattern formed therein. The remaining geometric areas of the array will be blank after that first photolithography operation.

Figures 3, 7, 8:
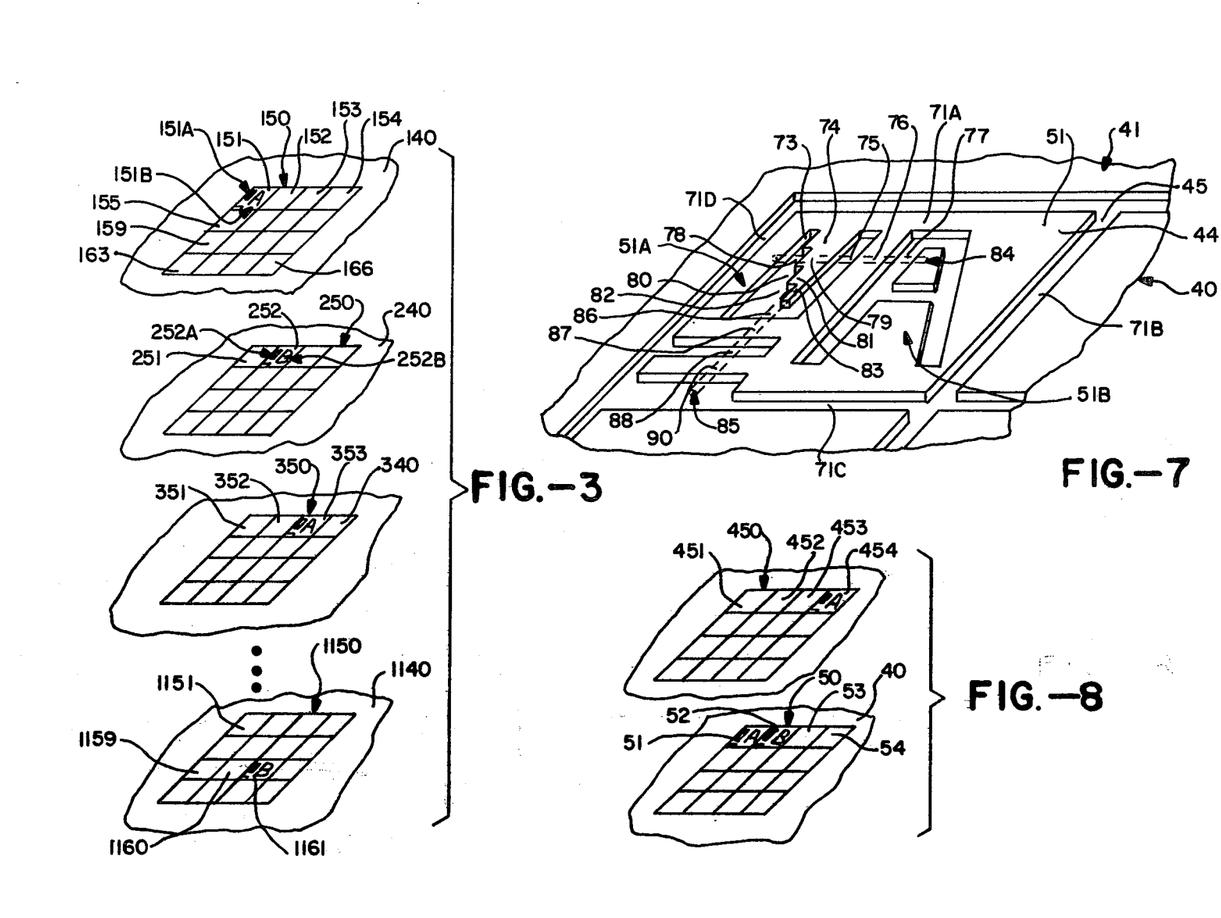
FIG. 3 depicts sections of individual photomasks in a photomask set utilizing the photomask sequence coding pattern of this invention.
FIG. 7 is an isometric view of a section of a semiconductor wafer having a portion of a photomask sequence coding pattern formed in a photoresist layer thereon.
FIG. 8 illustrates the manner of utilizing the photomask sequence coding pattern of this invention.

FIG. 3 illustrates a set of eleven photomasks utilized to form the coding pattern 50 on die 41 in FIG. 2. Sections of each photomask corresponding to the coding pattern formed thereon are illustrated in FIG. 3. It will of course be understood that other portions of the photomask contain the topography pattern associated with the particular structure to be created in the integrated circuit die utilizing that photomask in a particular photolithography operation and the etching, diffusion and/or other operations performed utilizing the mask pattern generated on the wafer. Thus as shown in FIG. 3, eleven photomasks 140, 240, 340, and so forth up to 1140 are depicted. Each of the photomasks 140 through 1140 may take different forms depending on the type of photomask structure which is being utilized by a particular company. Generally, however, each photomask will constitute a rigid substrate such as glass on which a pattern of light opaque and light transmissive regions have been formed so that the photomask may be utilized to expose a layer of photoresist material formed on a semiconductor wafer.

Each of the photomasks may be a dark field photomask or a light field photomask depending on whether the photomask is to be utilized with a positive or negative photoresist. Preferably, however, the photomask sequence coding pattern on each photomask is formed of a light field structure, that is with opaque coding pattern areas formed on transmissive square geometric areas so that the coding pattern in the mask is visible and the coding pattern elements already recorded on the chip are also visible through the photomask while it is being aligned on the wafer.

As shown in FIG. 3, the first photomask 140 has the marked array of square geometric areas 150 formed thereon and has the critical dimension pattern 151A and the mask revision level pattern 151B formed in the first square 151 of the array 150. This corresponds to the selected coding sequence mentioned above. Each of the other geometric areas 152 through 166 remain blank. In other words, each of these areas is simply a light transmissive area with no pattern incorporated into it.

The second photomask 240 has a marked array 250 formed thereon with the critical dimension pattern 252A and the mask revision level pattern 252B formed in the second square 252 of the array. Similarly the third photomask 340 has the critical dimension pattern and mask revision level pattern formed in the third square 353 of the marked array 350. Each of the following photomasks four through ten would have the critical dimension pattern and the mask revision level pattern formed in corresponding fourth through tenth squares of the arrays formed on each of these photomasks. Photomask eleven as shown has the critical dimension pattern and the mask revision level pattern formed in the eleventh square 1161 of the array 1150.

Figure 4A:
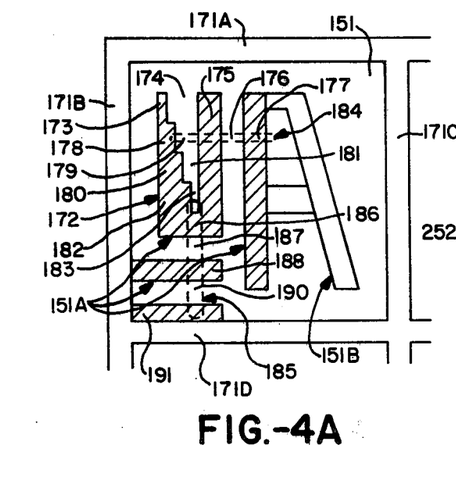
FIGS. 4A and 4B depict blown up sections of the photomask sequence coding pattern of this invention shown in FIG. 3.

FIG. 4A illustrates the structure of the critical dimension pattern 151A and the mask revision level pattern 151B formed on photomask 140 in FIG. 3. The description given of these critical dimension patterns and mask revision level patterns will assume a semiconductor process technology which utilizes three micron critical dimensions. If the technology has a larger or smaller critical dimension, then the widths of the lines making up the array and the critical dimension pattern and mask revision level pattern would change correspondingly. The array of geometric areas in the coding pattern depicted in FIGS. 2 and 3 is an area of square geometric regions formed by the grid 67 (FIG. 2) of which the lines designated 171A to 171D in FIG. 4A are exemplary. Each of these lines may comprise a three micron wide line and each of the square geometric areas may comprise a 34 micron by 34 micron area. To maintain the overall array within a dimension of 150 microns by 150 microns the bottom line in the grid and the far right line in the grid shown in FIG. 2 may consist of two micron lines. There is no particular criticality to these dimensions and somewhat larger or smaller areas could be used if desired.

As shown in FIG. 4A, the critical dimension pattern 151A consists of a stairstep pattern segment 172, a vertical line segment 177 which is integrated with the mask revision level code 151B, and a pair of horizontal bars 188 and 190. The stairstep pattern 172 includes a first line section 173 which is one micron wide and four microns long. It is separated from the grid line 171B by four microns and from the grid line 171A by four microns. The second line segment 178 in the stairstep pattern is two microns wide, the third line segment 180 is three microns wide, and the fourth line segment 182 is four microns wide. The section 186 is eight microns wide and three microns long and connects the stairstep pattern with the line section 175 which is three microns wide. Accordingly, between the line section 173 and the line section 175 is a space which is four microns wide. Between the line sections 178 and 175 is a three micron space 179. Between the line sections 180 and 175 is a two micron space 181 and between the line sections 182 and 175 is a one micron space 183. Between the line section 175 and the line section 177 is a space 176 which is also three microns wide. The horizontal line section 188 is three microns wide and is separated from the bottom section 186 by a three micron space 187. The horizontal line segment 191 is two microns high and is separated from the horizontal line segment 188 by a three micron space 190.

The critical dimension pattern 151A is specifically adapted to permit use of automatic microline measuring equipment which scans the critical dimension pattern over a horizontal scan path designated 184 and/or over a vertical scan path 185. This automatic microline measuring equipment is adapted for measuring the critical three micron dimensions both horizontally and vertically and preferably utilizes a critical dimension pattern which has two three micron spaces and two three micron lines to enhance the accuracy of the measurement. As depicted in FIGS. 2, 3, 4A and 4B, one version of a mask revision level pattern involves the use of alphabetic letters A, B, C, D, etc. to indicate the mask revision level. In this pattern, the letter A would indicate the original mask version, the letter B would indicate the first revision of the original mask version, the letter C would indicate the second revision of the mask. Alternatively the portion corresponding to the A in FIG. 4A except for the lefthand line segment forming an integral part of the critical dimension pattern could be eliminated in the original mask version such that the alphabetic designation A could indicate the first revision of the original mask, the alphabetic designation B then indicating the second revision of the mask.

Figure 4B:
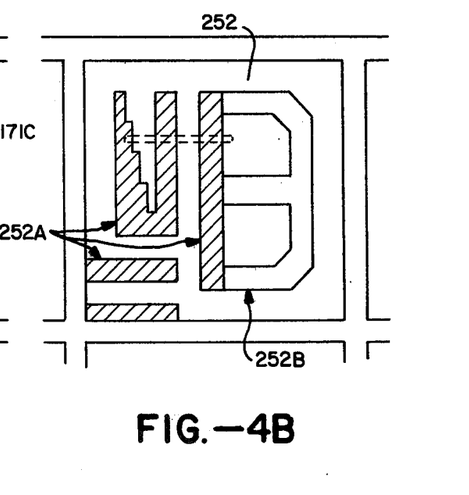

FIG. 4 illustrates an alternative version of a coding scheme for the mask revision level. In this case vertical and horizontal bar patterns are utilized to indicate the revision level. The first vertical bar I would designate the original mask design, the second vertical bar II added to the first vertical bar labeled I would indicate the first revision of the mask. Including the third vertical bar III in the pattern would indicate the second revision of the mask. Correspondingly, the three horizontal bars labeled IV, V, and VI would indicate the fourth, fifth, and sixth versions of the mask or the third, fourth, and fifth revisions of the mask. As can be seen in FIG. 4, the revision level code of this alternative type also integrates a segment of the code into the critical dimension pattern 151A to retain the pattern of three micron lines and spaces of the version depicted in FIG. 4A.

Figure 5:
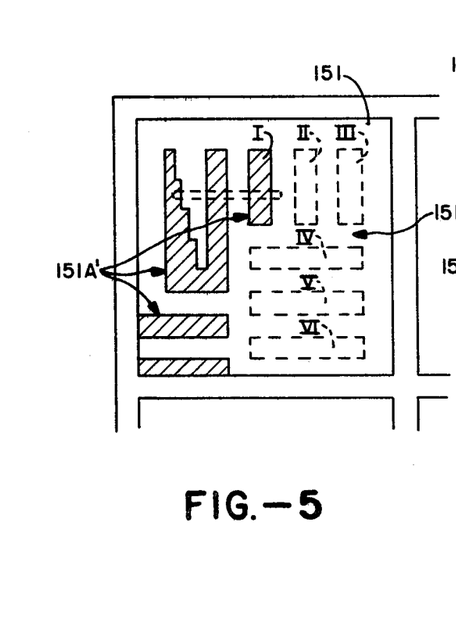
FIG. 5 depicts an alternative version of a portion of a photomask sequence coding pattern in accordance with this invention.
Figure 6:
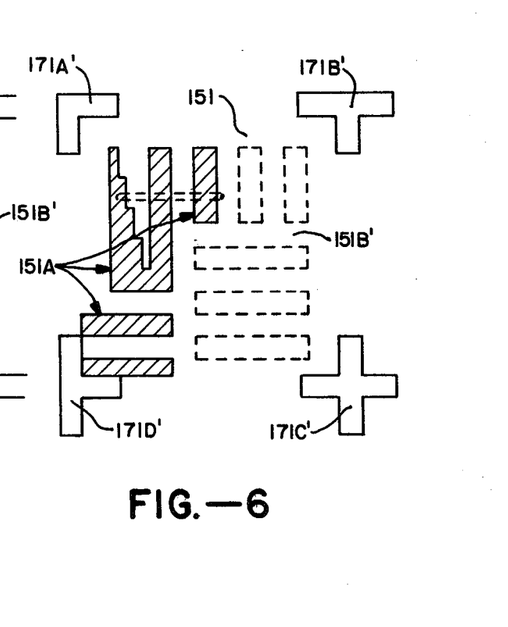
FIG. 6 depicts another alternative photomask sequence coding pattern in accordance with this invention.

FIG. 5 illustrates an alternative approach to marking the array of geometric areas forming the coding pattern of this invention. Instead of using a complete grid line arrangement to define the square array of geometric regions, other marking approaches such as the pattern of partial and complete crosses 171A' through 171D' may be utilized. Any other approach to marking the geometric areas in the array could also be used.

FIG. 7 illustrates the appearance of a section of the surface of a wafer 40 after the first photolithography operation utilizing mask 140 in FIG. 3 has been performed. In particular, FIG. 7 shows a portion of the topography and topology of the die 41 on wafer 40 corresponding to the geometric area 51 shown in FIG. 2. As shown, a layer of photoresist 44 on wafer 40 has been patterned to correspond to the photomask sequence coding pattern 150 on photomask 140. Underlying patterned photoresist layer 44 is an unpatterned layer of silicon dioxide 45 which has previously been grown on the surface of the semiconductor wafer 40. The patterned photoresist layer 44 is illustrated in a fashion in which it would appear if the resolution of the photolithography operation were essentially perfect. In other words, all of the corners of the square areas of the photomask have been perfectly reproduced in photoresist layer 44 as depicted in FIG. 7. Furthermore, the critical dimension pattern 151A and the mask revision level code letter 151B have been perfectly formed in the photoresist layer. As those in this art will appreciate this is the ideal case which is not achieved in practice. Instead the patterned photoresist layer 44 will only partially reproduce the geometry of the photomask pattern with the corners of the pattern rounded off. In at least some instances, some of the structural detail of the critical dimension pattern, in particular portions of the stairstep portion of the pattern, will be lost in the photolithography operation. For example, the one micron space designated 173 and the one micron line designated 183 may be obliterated in the photoresist pattern. However, the overall critical dimension pattern and mask revision level pattern will be visible in the patterned photoresist layer 44 if the photolithography operation has been properly carried out.

From the isometric view given in FIG. 7, it will be readily apparent that the critical dimension pattern can be utilized with manual visual inspection to ascertain the minimum resolved region in the photoresist pattern. For example, if only the two micron lines and spaces are resolved on visual inspection, the inspector can ascertain that the resolution of that photolithography operation has been two microns. Utilizing this manual approach quality control inspectors can readily determine whether the minimum three micron resolution has been obtained in patterning the photoresist utilizing the mask 140. FIG. 7 also illustrates the scanning path of an automatic microline measuring apparatus which may also be utilized with the critical dimension pattern illustrated to automatically measure the accuracy of photolithographic reproduction of the three micron lines and spaces in the mask pattern.

After the photoresist layer has been patterned as shown in FIG. 7, typically an etch operation will be carried out to etch through the oxide layer 45 to the surface of the semiconductor wafer 40. After this etch operation has been performed the oxide layer 45 will be patterned corresponding to the pattern in the photoresist layer 44. Thereafter, the photoresist layer 44 may be removed and the pattern in the oxide layer 45 utilized as a diffusion or ion implant mask pattern for introducing dopant material into selected regions of the semiconductor wafer. After the photoresist pattern has been removed, the patterned layer of oxide will also be checked to determine whether the critical dimension has been accurately reproduced. This serves as a check on whether or not the etching operation on the oxide was properly carried out. After a diffusion or implant operation has been carried out on the wafer 40 using the patterned oxide layer 45 as a mask, typically the oxide layer will be regrown to a certain thickness and then repatterned in the next photolithography step. During the process of regrowing the oxide a topology of different thickness in the oxide layer will be produced and this pattern of differential oxide layer thickness will be reproduced in the layer of photoresist coated on the wafer 40 prior to utilizing the second mask 240 to pattern this second layer of photoresist. If the second mask 240 is a light field mask, utilized with negative photoresist, photoresist will be left in the geometric region corresponding to square 251 in mask 240. Accordingly, the geometric region 151 depicted in FIG. 7 on wafer 40 will be, at this time, completely covered with photoresist and the critical dimension pattern and mask revision level pattern shown in square 252 of array 250 will be reproduced in the adjacent square region 52 on wafer 40. After the second photolithography operation, utilizing the second mask 240, has been carried out and any following wafer processing steps such as diffusion and oxide regrowth are performed, the wafer 40 will have the coding pattern 50 shown in FIG. 8.

If the second photomask 240 shown in FIG. 3 is a dark field photomask utilized with positive photoresist, the light field portion comprising photomask sequence coding pattern 250 will produce a corresponding pattern in the photoresist layer which is essentially inverted from that shown in FIG. 7. In other words, instead of the critical dimension and mask revision level patterns consisting of areas of the photoresist layer which have been developed away, forming void regions in the photoresist layer, the pattern will be reversed with the critical dimension and mask revision level code patterns remaining as sections of photoresist with the surrounding areas removed. It will also be understood that the adjacent blank sections, 51, 53, 54, etc. of the coding pattern will also be totally removed from the photoresist layer. Consequently, when an etching operation on the oxide is performed to remove it down to the surface of the wafer, the topology of that oxide layer will be eliminated in the adjacent regions of the coding pattern. However, due to the nature of the process of oxide regrowth, there will remain in the surface of the semiconductor substrate a pattern of differential heights of the substrate surface due to different amounts of the silicon substrate having been consumed in growing the oxide layer at that location on the wafer. Consequently, the previously formed pattern in region 51 depicted in FIG. 7 will remain visible on the surface of the semiconductor wafer even after the topologic pattern in the oxide layer is removed during the second photolithography and etching operation. It would, of course, be possible to utilize a dark field coating pattern region on a dark field mask, but then it would be difficult for the mask alignment operator to see through the coding pattern area to determine that the proper mask for the instant photolithography operation is being utilized.

FIG. 8 illustrates how the operator performing mask alignment can utilize the coding pattern of this invention to determine whether the next proper photomask in sequence has been selected for use at this portion of the process. As shown in FIG. 8, the wafer 40 has been subjected to two sequential photolithography operations indicated by the presence of the critical dimension and mask revision level patterns in regions 51 and 52. In this case the operator is attempting to align photomask 440 on wafer 40. During this aligning process, the operator will look at the photomask sequence coding pattern 450 and correlate it with the coding pattern already formed on the wafer 40 and will note that she has selected the wrong photomask in sequence. In particular, she will notice that she has selected the fourth photomask when the third photomask should have been utilized. This will be apparent since the critical dimension and mask revision level patterns are found on region number 454 and should have been in region 453.

FIG. 8 illustrates other advantages that are available from the utilization of the photomask sequence coding pattern of this invention. One of these advantages is that the operator who is aligning the photomasks can utilize the grid arrangement of the coding pattern on the photomask as an initial rough alignment key to bring the photomask pattern into alignment with the pattern already created in the wafer 40. In other words, once the first photomask 140 has been utilized and has formed on the wafer the grid structure which defines the geometric areas of the coding pattern, the next sequences of photomasks may be roughly aligned with the grid area on the photomask aligned to the grid area defined on the wafer. Another benefit that is realized using the coding pattern of this invention is that the operator can readily ascertain that the orientation of the photomask being aligned to the wafer is proper. If the photomask were 90 degrees or 180 degrees off, the operator would readily be able to tell this by the respective orientation of the grid pattern on the mask with respect to that of the wafer utilizing the critical dimension and mask revision level pattern as indicia of relative orientation. In this manner not only is the proper mask in the sequence made obvious to the operator but the proper orientation of that mask with respect to the wafer is made readily apparent.

While the photomask sequence coding pattern system of this invention has been described above in connection with a preferred embodiment, it should be understood that numerous changes could be made without departing from the concepts of the invention. The preferred embodiment utilizes both a critical dimension pattern and a mask revision level pattern in the geometric region of the coding pattern corresponding to the mask level or sequence. It should be understood that, should the mask revision level information not be desired to be included, the critical dimension pattern alone could be utilized to indicate the mask sequence number. It should also be understood that various forms of critical dimension patterns could be utilized and the invention is not limited to the preferred form shown in the drawings and described above. As described above the mask revision level pattern and the critical dimension pattern are preferably partially integrated together to conserve space on each die on the semiconductor wafer. It should be obvious that many of the advantages of this invention could also be achieved by utilizing a different critical dimension pattern which is not integrated with the mask revision level pattern. It should also be apparent that various other forms of geometric areas or regions could be utilized instead of the array of square regions depicted in the drawings and described above. Accordingly, the coding pattern could use an array of rectangular regions, or an array of triangular or hexagonal regions.

Although the photomask sequence coding pattern is described as being located in the lower righthand corner of each die on the wafer, it should be apparent that this coding pattern could be placed at any location on the individual die on the wafer. The location shown in the drawings and described above is preferred in order to integrate this photomask sequence coding pattern into an overall arrangement for recording information on individual die on a semiconductor wafer as disclosed in a copending and commonly assigned patent application entitled "System for Design and Production of Integrated Circuit Photomasks and Integrated Circuit Devices", Ser. No. 222,253, filed on Jan. 2, 1981, now U.S. Pat. No. 4,343,877. This copending application discloses the utilization of each of the four corners of each die on the wafer and the corresponding four corners of each die region on the photomasks utilized in the processing sequence to communicate and record important information utilized both during wafer processing and subsequent to processing the wafer into individual IC chips.

The photomask sequence coding pattern illustrated in FIG. 2 may be utilized in connection with a semiconductor processing operation up to sixteen photomasks. It should be apparent that for semiconductor processes which do not require this number of photomasks, smaller coding pattern arrays could be utilized on the chip. If semiconductor processes using more than sixteen photomasks are developed, a larger coding pattern array could be used. Some MOS processes utilize only seven or eight photomasks so that a much smaller array of geometric areas could be provided in the mask coding pattern. It will thus be apparent that numerous modifications can be made to the embodiments of this invention disclosed in the drawings and discussed above without departing from the scope of the invention as claimed in the following claims.

What is claimed is:

1. A method for specifying and mask sequence numbers on photomasks used for processing semiconductor wafers into semiconductor integrated circuits comprising the steps of:

selecting prior-to-mask design and generation a photomask subarea to be utilized as a mask coding pattern area on each photomask and to be left free of circuit topography patterns; and forming on each photomask designed and generated for sequential use during sequential photolithography steps in wafer processing a mask coding pattern in the form of a prearranged marked array of geometric areas together with a preselected indicia located in a prearranged one of said geometric areas indicating the particular mask sequence number associated with each of said photomasks.

2. The method of claim 1, wherein said preselected indicia comprises a critical dimension pattern.

3. The method of claim 1, wherein said preselected indicia comprises a prearranged code indicating the revision level of each mask is also formed along with a critical dimension pattern in said prearranged geometric area of each of said photomasks.

4. The method of claim 3, wherein said preselected indicia further comprises a critical dimension pattern including vertical and horizontal arrangements of repetitive line and space segments corresponding to the critical dimension for the process to enable automatic line dimension measuring equipment to read said critical dimension replicated into the wafer after each mask is used in an associated photolithography process, and at least one segment of said mask revision level code is incorporated into at least one of said vertical and horizontal arrangements to reduce the space requirement of said mask revision level code.

5. The method of claim 4, wherein said critical dimension pattern is formed in the left side of said prearranged geometric area, said mask revision level code utilizes preselected letters of the English alphabet each having a vertical line segment as its leftmost letter segment, and said vertical line segment in said mask revision level code is incorporated into said vertical arrangement of line and space segments in said critical dimension pattern.

6. In a process for the design and manufacture of integrated circuit chips, the steps of:

designing each of a plurality of photomasks required to be utilized in sequence for performing photolithography operations in conjunction with a particular semiconductor integrated circuit fabrication process while leaving a prearranged common subarea on each of said photomasks free of circuit topography to be utilized as a mask coding pattern area;

forming on each of said photomasks at the time of photomask generation a mask coding pattern in the form of a prearranged marked array of geometric areas together with a preselected indicia located in a prearranged one of said geometric areas indicating the particular mask layer number for each of said photomasks;

performing on a semiconductor wafer a prearranged sequence of processing steps including a prearranged sequence of photolithography processing steps each using one of said photomasks in sequence; and checking the proper sequencing of photomask use during each photolithography processing step using said preselected indicia location in said array on a selected photomask together with the replicated indicia produced on the wafer as a result of prior photolithography processing steps to verify proper selection of the next photomask in said processing sequence.

7. The method of claim 6, wherein said preselected indicia comprises a critical dimension pattern.

8. The method of claim 7, wherein a code indicating the revision level of each mask is also formed along with said critical dimension pattern in said prearranged geometric area to enable verification of the proper current revision level of each mask utilized in the processing sequence.

9. The method of claim 8, wherein said critical dimension pattern includes vertical and horizontal arrangements of repetitive line and space segments corresponding to the critical dimension for said process to enable automatic line dimension measuring apparatus to read said critical dimension on said wafer after each photolithography processing sequence, and at least one segment of said mask revision level code is incorporated into at least one of said vertical and horizontal arrangements for conserving area on said wafer devoted to said mask layer identification.

10. The method of claim 9, wherein said critical dimension pattern is formed in the left side of said prearranged geometric area, said mask revision level code utilizes preselected letters of the English alphabet each having a vertical line segment as its leftmost letter segment, and said vertical line segment is incorporated into said vertical arrangement of line and space segments in said critical dimension pattern.

11. In a set of photomasks adapted to be used during sequential photolithography processing steps in an overall process for manufacturing integrated circuit chips on a semiconductor wafer, a coding pattern for specifying critical dimensions and mask layer numbers for each of said photomasks comprising a preselected common subarea of each photomask free of circuit topography patterns and having formed thereon a prearranged marked array of geometric areas together with a preselected critical dimension pattern located in a prearranged one of said geometric areas indicating the particular mask layer number for each of said photomasks.

12. The photomask set of claim 11, wherein said coding pattern is also adapted to specify mask revision levels for each photomask, and a code indicating the revision level of each mask is also formed along with said critical dimension pattern in said prearranged geometric area on said mask.

13. The photomask set of claim 12, wherein said critical dimension pattern includes vertical and horizontal arrangements of repetitive line and space segments corresponding to the critical dimension for the process to enable automatic line dimension measuring apparatus to read said critical dimension after each use of said photomask during a photolithography processing step, and at least one segment of said mask revision level code is incorporated into at least one of said vertical and horizontal arrangements to conserve the space occupied by said coding pattern.

14. The photomask set of claim 13, wherein said critical dimension pattern is formed in the left side of said prearranged geometric area, said mask revision level code utilizes preselected letters of the English alphabet each having a vertical line segment as its leftmost letter segment, and said vertical line segment is incorporated into said vertical arrangement of line and space segments in said critical dimension pattern.

* * * * *